(12) United States Patent
Iguchi

(10) Patent No.: US 11,133,427 B2
(45) Date of Patent: Sep. 28, 2021

(54) LIGHT RECEIVING DEVICE

(71) Applicant: SUMITOMO ELECTRIC INDUSTRIES, LTD., Osaka (JP)

(72) Inventor: Yasuhiro Iguchi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/999,421

(22) Filed: Aug. 21, 2020

(65) Prior Publication Data

US 2021/0066521 A1 Mar. 4, 2021

(30) Foreign Application Priority Data

Aug. 28, 2019 (JP) .............................. JP2019-155612

(51) Int. Cl.
*H01L 31/0304* (2006.01)
*H01L 27/146* (2006.01)
*H01L 31/109* (2006.01)

(52) U.S. Cl.
CPC .... *H01L 31/03046* (2013.01); *H01L 27/1463* (2013.01); *H01L 31/109* (2013.01)

(58) Field of Classification Search
CPC ............. H01L 31/03046; H01L 31/109; H01L 27/1463; H01L 27/1446; H01L 27/1443
See application file for complete search history.

(56) References Cited

U.S. PATENT DOCUMENTS

| 4,761,680 | A | * | 8/1988 | Longeway ............ H01L 31/105 257/189 |
| 6,740,908 | B1 | * | 5/2004 | Giboney ......... H01L 31/022408 257/185 |
| 8,212,286 | B2 | | 7/2012 | Fujii |
| 2007/0235758 | A1 | * | 10/2007 | Klipstein .............. H01L 31/101 257/188 |
| 2008/0012042 | A1 | * | 1/2008 | Sugawara ............. H01L 23/045 257/147 |
| 2013/0248821 | A1 | * | 9/2013 | Miura ................ H01L 21/02546 257/21 |
| 2014/0070231 | A1 | * | 3/2014 | Soloviev ............. H01L 27/0817 257/77 |
| 2017/0358696 | A1 | * | 12/2017 | Aga ................. H01L 31/035236 |

FOREIGN PATENT DOCUMENTS

| JP | 2011-035114 | 2/2011 |
| WO | 2009/081585 | 7/2009 |

* cited by examiner

*Primary Examiner* — Sitaramarao S Yechuri
(74) *Attorney, Agent, or Firm* — IPUSA, PLLC

(57) ABSTRACT

A light receiving device includes a substrate, a first contact layer disposed on a surface of the substrate, a light receiving layer disposed on the first contact layer, an intermediate layer disposed on the light receiving layer, a wide-gap layer having a pn junction disposed on the intermediate layer, a second contact layer disposed on the wide-gap layer, and a groove formed for pixel isolation by removing the second contact layer and part of the wide-gap layer, wherein the intermediate layer has a wider band gap than the light receiving layer, and wherein the wide-gap layer has a wider band gap than the intermediate layer.

7 Claims, 17 Drawing Sheets

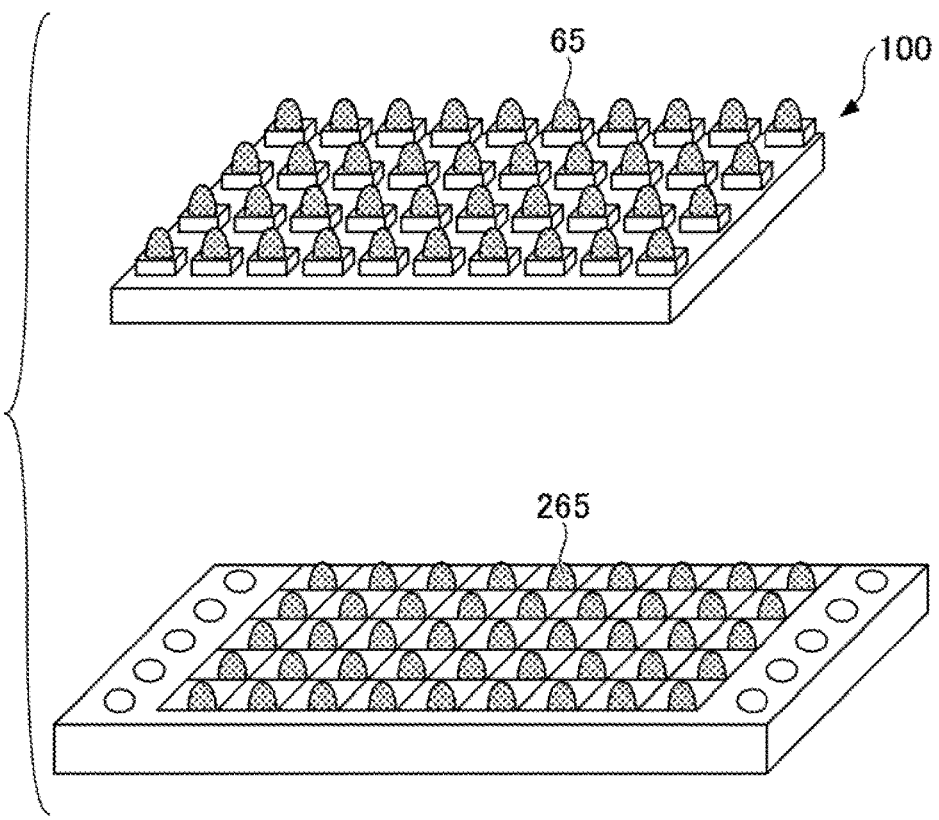
FIG.18
FIG.19
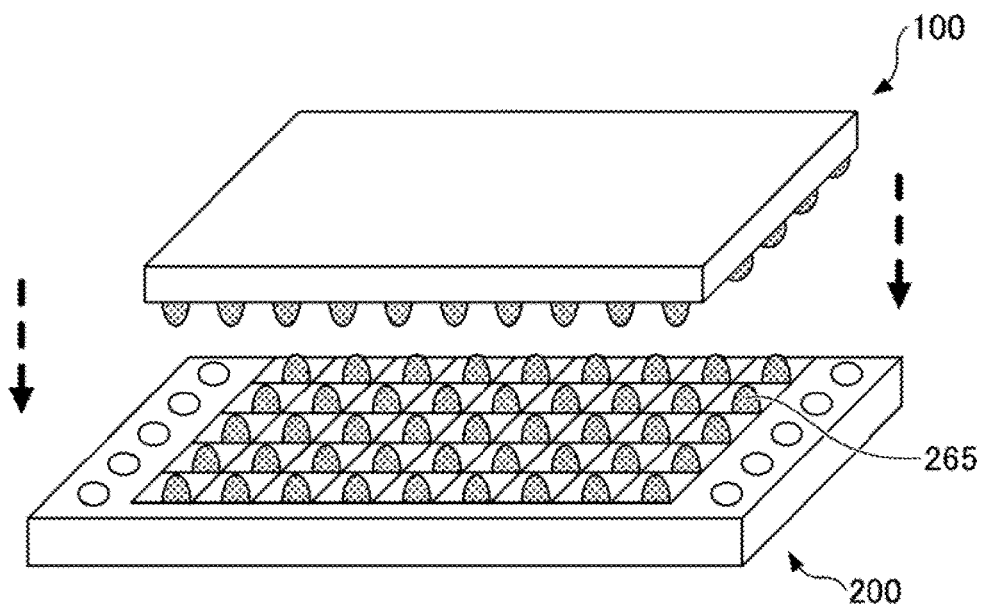

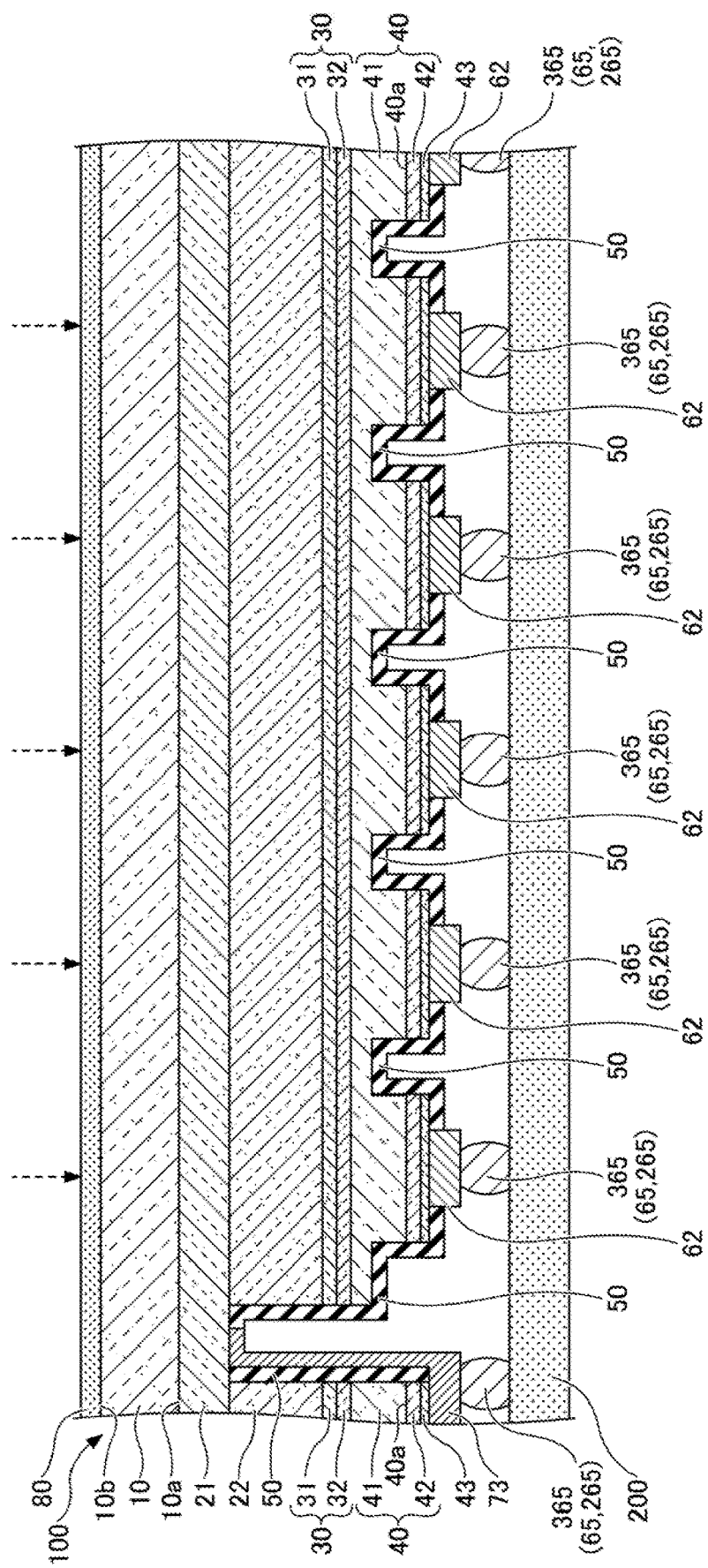

LIGHT RECEIVING DEVICE

BACKGROUND OF THE INVENTION

1. Field of the Invention

The disclosures herein relate to a light receiving device.

2. Description of the Related Art

As a light receiving device for detecting near-infrared light, a photodiode may use a III-V compound semiconductor as a light receiving layer for absorbing near-infrared light. As an example, a mesa photodiode made by forming a mesa is known in the art.

Light receiving devices are required to have reduced dark current. In recent years, high-speed response has also been required in some cases.

[Patent Document 1] Japanese Laid-open Patent Publication No. 2011-35114

[Patent Document 2] International Publication Pamphlet No. WO2009/081585

SUMMARY OF THE INVENTION

According to an embodiment, a light receiving device includes a substrate, a first contact layer disposed on a surface of the substrate, a light receiving layer disposed on the first contact layer, an intermediate layer disposed on the light receiving layer, a wide-gap layer having a pn junction disposed on the intermediate layer, a second contact layer disposed on the wide-gap layer, and a groove formed for pixel isolation by removing the second contact layer and part of the wide-gap layer. The intermediate layer has a wider band gap than the light receiving layer, and the wide-gap layer has a wider band gap than the intermediate layer.

According to at least one embodiment, the light receiving device has increased responsiveness.

BRIEF DESCRIPTION OF THE DRAWINGS

Other objects and further features of the present invention will be apparent from the following detailed description when read in conjunction with the accompanying drawings, in which:

FIG. 18 is a drawing illustrating a step of manufacturing a light detecting apparatus according to an embodiment;

FIG. 19 is a drawing illustrating a step of manufacturing the light detecting apparatus according to the embodiment;

FIG. 21 is a cross-sectional view of a main portion of the light detecting apparatus according to the embodiment.

DESCRIPTION OF THE PREFERRED EMBODIMENTS

Figure 1:
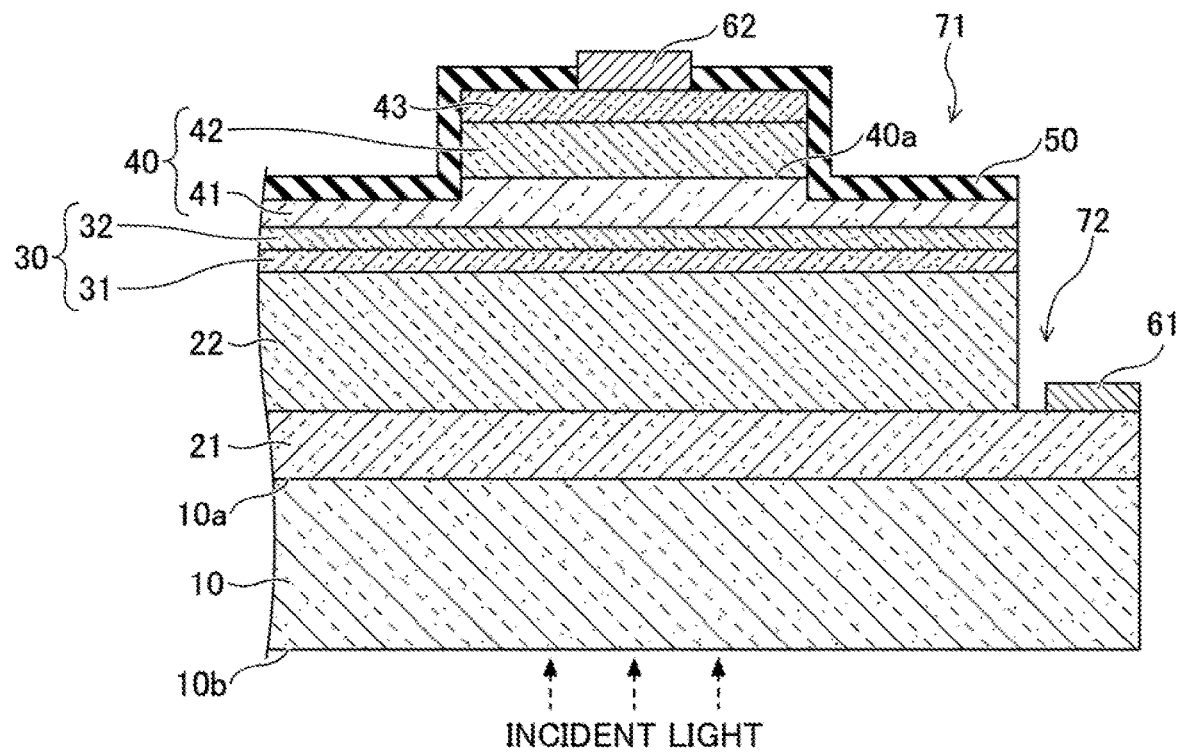
FIG. 1 is a cross-sectional view of a light receiving device according to an embodiment.

Embodiments will be described in the following.

Description of Embodiments of the Present Disclosures

Embodiments of the present disclosures will be listed and described first. In the following description, the same or corresponding elements are referred to by the same reference numerals, and a duplicate description thereof will be omitted.

[1] A light receiving device according to an aspect of the present disclosures includes a substrate, a first contact layer disposed on a surface of the substrate, a light receiving layer disposed on the first contact layer, an intermediate layer disposed on the light receiving layer, a wide-gap layer having a pn junction disposed on the intermediate layer, a second contact layer disposed on the wide-gap layer, and a groove formed for pixel isolation by removing the second contact layer and part of the wide-gap layer, wherein the intermediate layer has a wider band gap than the light receiving layer, and the wide-gap layer has a wider band gap than the intermediate layer.

This arrangement increases the responsiveness of the light receiving device.

[2] The intermediate layer is made of a plurality of layers having different composition ratios, and the plurality of layers are arranged in an ascending order of band gaps from the light receiving layer to the wide-gap layer.

This arrangement further increases the responsiveness of the light receiving device.

[3] The wide-gap layer includes a p-type wide-gap layer and an n-type wide-gap layer, the n-type wide-gap layer serving as a bottom face of the groove.

This arrangement enables reliable pixel isolation in the light receiving device.

[4] Light incident on an opposite surface of the substrate is detected.

The light receiving device of the present disclosures is such a type that detects light incident on the back side.

[5] The light receiving layer includes InGaAs, and the intermediate layer includes InGaAsP, with the wide-gap layer including InP.

The light receiving device of the present disclosures is such a type that detects near-infrared light.

[6] A side face of the wide-gap layer situated at a sidewall of the groove is covered with a passivation film made of SiN or SiON.

This arrangement improves reliability without causing an increase in dark current.

[7] The first contact layer is an n-type contact layer, and the second contact layer is a p-type contact layer.

The light receiving device of the present disclosures is such that holes move from the light receiving layer toward the wide-gap layer. Provision of the intermediate layer facilitates the movement of holes, thereby increasing the responsiveness of the light receiving device.

[8] Pixels isolated by a plurality of said grooves are arranged in a one-dimensional array or in a two-dimensional array.

This arrangement provides a one-dimensional-array or two-dimensional-array light receiving device.

Details of Embodiments of the Present Disclosures

In the following, an embodiment of the present disclosures will be described in detail, but the present embodiments are not limited to those disclosed herein.

Light receiving devices for detecting near-infrared light have been required to have reduced dark current. New practical application of light receiving devices is their use as sensors in autonomous driving or the like. In such application, an automobile or the like has a light emitting laser device and a light receiving device installed therein. When an object is present in front of the automobile, laser light emitted from the light emitting device is reflected at the object, so that the light receiving device detects the reflected light. This arrangement, enables the detection of an object present in front of the automobile or the like.

Sensor arrangement in an automobile or the like is such that a light emitting device emits laser pulses, and a light receiving device receives the laser pulses reflected back from an object in front. Because of this, a low responsiveness of the light, receiving device may cause a situation in which the electrical signal of a first reflected light pulse does not fully attenuate before the arrival of a next reflected light pulse. As a result, the presence of the object may not be correctly detected.

Sensors used in autonomous driving or the like are thus required to use a light receiving device having high responsiveness for detecting near-infrared light.

Light Receiving Device

Figure 2:
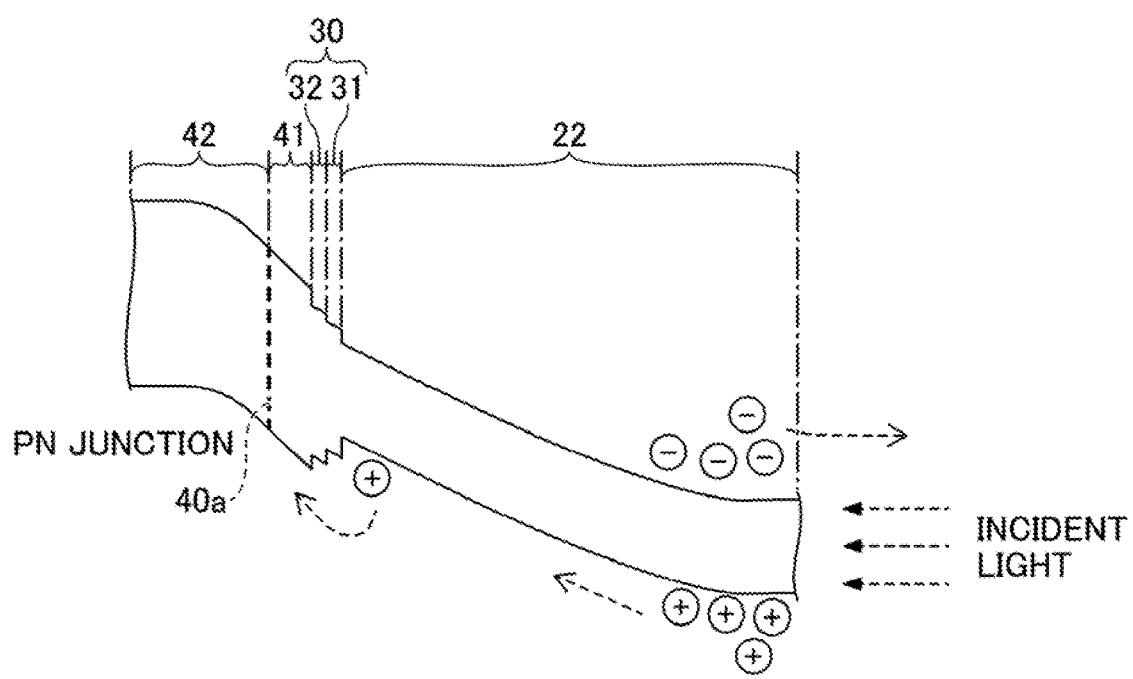
FIG. 2 is a band diagram illustrating a main portion of the light receiving device according the embodiment.

In the following, a light receiving device according to a present embodiment will be described with reference to FIG. 1 and FIG. 2. The light receiving device of the present embodiment is such a type that detects near-infrared light and that is referred to as a back-illuminated light receiving device. FIG. 1 schematically illustrates the cross-sectional structure of the light receiving device according to the present embodiment. FIG. 2 is a band diagram of a light receiving layer 22, an intermediate layer 30, an n-type wide-gap layer 41, and a p-type wide-gap layer 42 of the light receiving device according to the present embodiment.

The light receiving device of the present embodiment is formed by laminating an n-type contact layer 21, the light receiving layer 22, the intermediate layer 30, a wide-gap layer 40, and a p-type contact layer 43 on one surface 10a of a substrate 10. The wide-gap layer 40 includes the n-type wide-gap layer 41 and the p-type wide-gap layer 42 formed in this order on the intermediate layer 30. A pn junction 40a is formed at the interface between the n-type wide-gap layer 41 and the p-type wide-gap layer 42 within the wide-gap layer 40. In the present application, the n-type contact layer 21 may sometimes be referred to as a first contact layer and the p-type contact layer 43 may sometimes be referred to as a second contact layer.

The substrate 10 has a thickness of approximately 350 μm, and is semi-insulated with Fe (iron) doped as an impurity element. The n-type contact layer 21 is implemented as an n-InP layer having a thickness of approximately 2 μm, and is doped with Si serving as an n-type impurity element at a concentration of about $2\times10^{18}$ cm$^{-3}$. The light receiving layer 22 is implemented as an $In_{0.53}Ga_{0.47}As$ layer having a thickness of approximately 3.5 μm without an impurity element doped therein, and has a band gap of 0.75 eV at room temperature. Since the light receiving layer 22 is not doped with an impurity element, the concentration of impurity elements present in the light receiving layer 22 is $1\times10^{15}$ cm$^{-3}$ or less.

The intermediate layer 30 is constituted by a plurality of InGaAsP layers having different composition ratios, which include a first intermediate layer 31 on the light receiving layer 22 and a second intermediate layer 32 on the first intermediate layer 31. The n-type wide-gap layer 41 is formed on the second intermediate layer 32. The first intermediate layer 31 is implemented as an $In_{0.72}Ga_{0.28}As_{0.61}P_{0.39}$ layer having a thickness of approximately 30 nm, and has a band gap of 0.954 eV at room temperature. The second intermediate layer 32 is implemented as an $In_{0.85}Ga_{0.15}As_{0.33}P_{0.67}$ layer having a thickness of approximately 30 nm, and has a band gap of 1.127 eV at room temperature. The first intermediate layer 31 and the second intermediate layer 32 are not doped with an impurity element. The concentration of impurity elements present in the first intermediate layer 31 and the second intermediate layer 32 is $2\times10^{15}$ cm$^{-3}$ or less. The present embodiment is configured such that the band gaps of the first intermediate layer 31 and the second intermediate layer 32 are between the band gap of the light receiving layer 22 and the band gap of the wide-gap layer 40, i.e., are wider than the band gap of the light receiving layer 22 and narrower than the band gap of the wide-gap layer 40. In addition, the band gap of the second intermediate layer 32 is wider than the band gap of the first intermediate layer 31. Accordingly, the band gap of the intermediate layer 30 gradually widens from the light receiving layer 22 toward the wide-gap layer 40.

The n-type wide-gap layer 41 is implemented as an n-InP layer having a thickness of approximately 0.5 μm, and is doped with Si serving as an n-type impurity element at a concentration of about $2\times10^{15}$ cm$^{-3}$. The p-type wide-gap layer 42 is implemented as an p-InP layer having a thickness of approximately 0.2 μm, and is doped with Zn serving as an p-type impurity element at a concentration of about $2\times10^{15}$ cm$^{-3}$. In the present embodiment, the pn junction 40a is formed at the interface between the n-type wide-gap layer 41 and the p-type wide-gap layer 42. The p-type contact layer 43 is implemented as a p-InGaAs layer having a thickness of approximately 0.1 μm, and is doped with Zn serving as a p-type impurity element at a concentration of about 1×10$^{19}$ cm$^{-3}$.

In the light receiving device of the present embodiment, a first groove 71 for pixel isolation and a second groove 72 for exposing the n-type contact layer 21 are formed. The first groove 71 is formed by removing the p-type contact layer 43, the p-type wide-gap layer 42, and part of the n-type wide-gap layer 41, with the n-type wide-gap layer 41 serving as the bottom surface thereof. A p-electrode 62 is formed on the p-type contact layer 43. A passivation film 50 is formed on the upper face of the p-type contact layer 43 and on the side faces of the p-type contact layer 43, the p-type wide-gap layer 42, and the n-type wide-gap layer 41. The side of the pn junction 40a is in contact with the passivation film 50.

The second groove 72 is formed by further removing the n-type wide-gap layer 41, the intermediate layer 30, and the light receiving layer 22, with the n-type contact layer 21 exposed at the bottom surface. An n-electrode 61 is formed on the exposed n-type contact layer 21. In the present embodiment, the passivation film 50 is made of SiN, the n-electrode 61 made of TiPtAu, and the p-electrode 62 made of TiPtAu. A voltage of −8 V is applied between the n-electrode 61 and the p-electrode 62 as a bias voltage. When near-infrared light is incident on the opposite surface 10b of the substrate 10, holes and electrons are generated by the incident light in the light receiving layer 22.

The band gap of InGaAs forming the light receiving layer 22 is 0.75 eV, and the band gap of InP forming the n-type wide-gap layer 41 is 1.35 eV, so that the difference in the band gap between the light receiving layer 22 and the n-type wide-gap layer 41 is large. In consideration of this, the light receiving device according to the present embodiment is configured such that, the intermediate layer 30 having an intermediate band gap between the band gap of InGaAs forming the light receiving layer 22 and the band gap of InP forming the n-type wide-gap layer 41 is provided between the light receiving layer 22 and the n-type wide-gap layer 41. Namely, the intermediate layer 30 is made of InGaAsP, which is a material having a band gap between the band gap of InGaAs, i.e., 0.75 eV, and the band gap of InP, i.e., 1.35 eV. The intermediate layer 30 may be implemented as a single layer, or may be implemented as two or more layers with different composition ratios, such that layers adjacent to each other have a reduced band gap difference.

Figure 3:
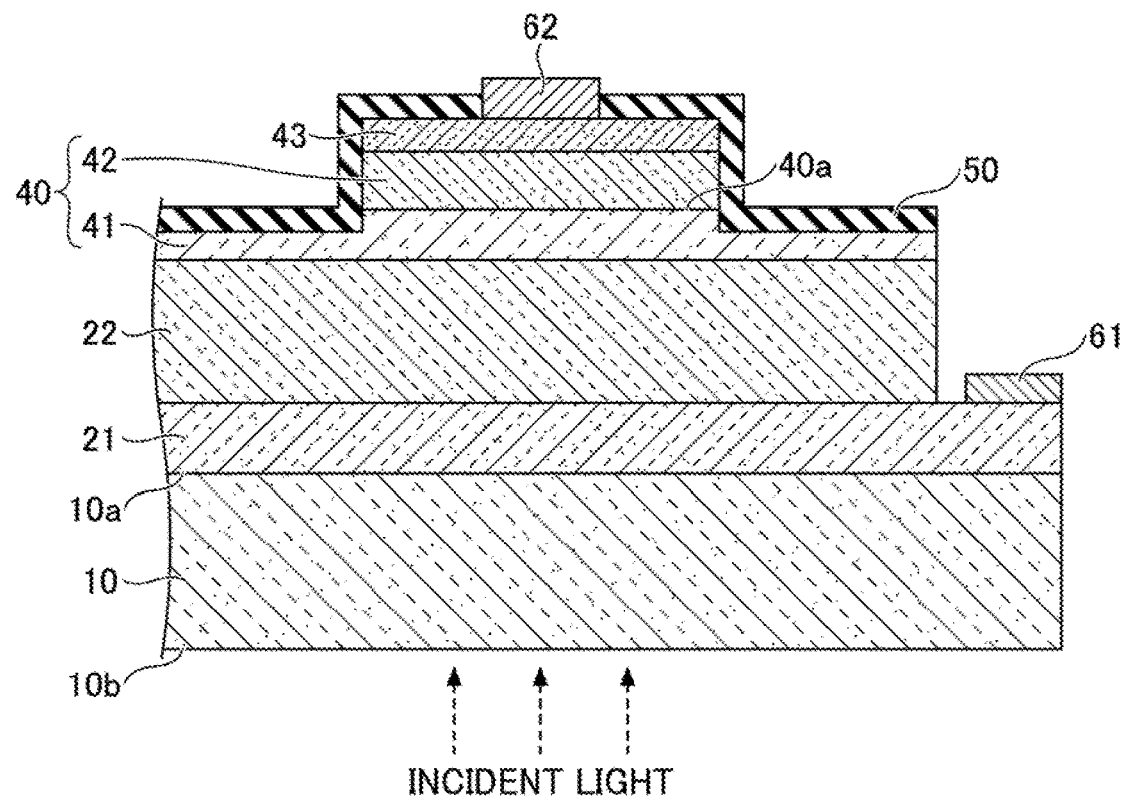
FIG. 3 is a cross-sectional view of a light receiving device having no intermediate layer.
Figure 4:
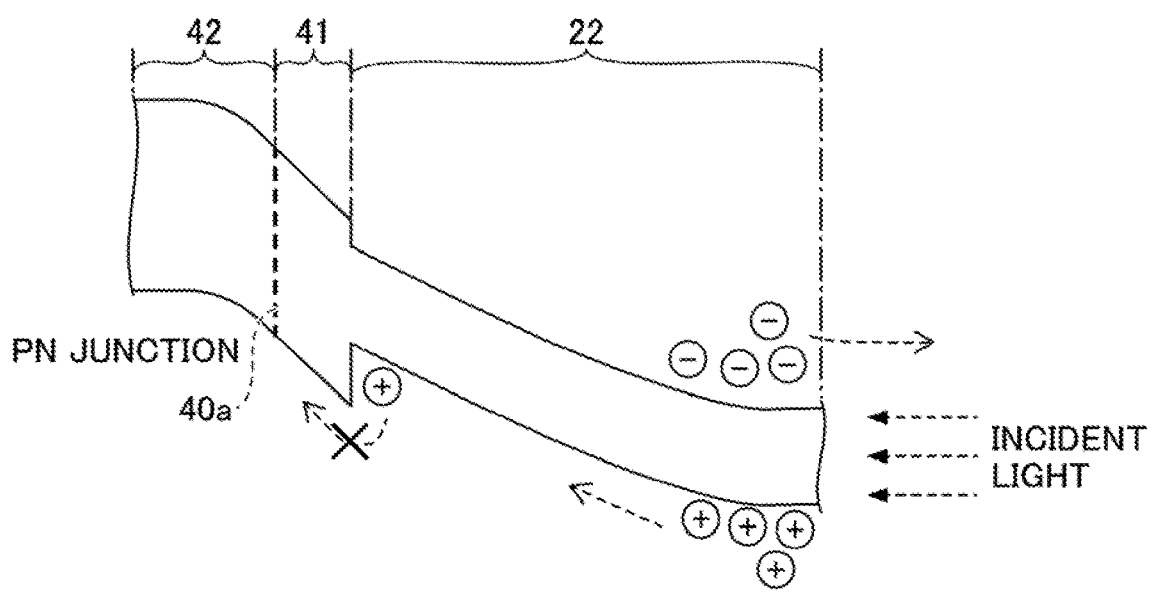
FIG. 4 is a band diagram illustrating a main portion of the light receiving device having no intermediate layer.

In the following, a light receiving device having no intermediate layer, as illustrated in FIG. 3, will be described for comparison purposes. FIG. 4 is a band diagram of a light receiving layer 22, an n-type wide-gap layer 41, and a p-type wide-gap layer 42 of the light receiving device illustrated in FIG. 3. As is illustrated in FIG. 4, near-infrared light incident on the surface 10b of the substrate 10 causes holes and electrons to be generated in the light receiving layer 22, with the electrons flowing toward the n-type contact layer 21 and the holes flowing toward the p-type contact layer 43. Because the difference in the band gap between the light receiving layer 22 and the n-type wide-gap layer 41 is as large as 0.60 eV, holes do not readily pass the barrier between the light receiving layer 22 and the n-type wide-gap layer 41, resulting in the movement of holes being hindered.

In contrast, the light receiving device according to the present embodiment is configured such that, as illustrated in FIG. 2, the intermediate layer 30 whose band gap is between the band gap of the light receiving layer 22 and the band gap of the n-type wide-gap layer 41 is provided between the light receiving layer 22 and the n-type wide-gap layer 41. The intermediate layer 30 includes the first intermediate layer 31 and the second intermediate layer 32 having different band gaps from each other, so that the holes generated in the light receiving layer 22 easily move from the light receiving layer 22 toward the n-type wide-gap layer 41.

The band gap of InGaAs forming the light receiving layer 22 is 0.75 eV, and the band gap of InGaAsP forming the first intermediate layer 31 is 0.954 eV, so that the difference in the band gap between the light receiving layer 22 and the first intermediate layer 31 is 0.204 eV. Further, the band gap of InGaAsP forming the second intermediate layer 32 is 1.127 eV, so that the difference in the band gap between the first intermediate layer 31 and the second intermediate layer 32 is 0.173 eV. Moreover, the band gap of InP forming the n-type wide-gap layer 41 is 1.35 eV, so that the difference in the band gap between the second intermediate layer 32 and the n-type wide-gap layer 41 is 0.223 eV.

Accordingly, the band gap gradually increases (i.e., widens) in a stepwise manner from the light receiving layer 22 to the first intermediate layer 31 to the second intermediate layer 32 to the n-type wide-gap layer 41. In this arrangement, the difference in the band gap between any two layers immediately adjacent to each other is smaller than 0.60 eV, which is observed in the case of band gaps illustrated in FIG. 4. Because of this, the barriers between the light receiving layer 22 and the first intermediate layer 31, between the first intermediate layer 31 and the second intermediate layer 32, and between the second intermediate layer 32 and the n-type wide-gap layer 41 are low and readily passed, which allows easy movement of holes. This achieves an increase in the responsiveness of the light receiving device.

Figure 5:
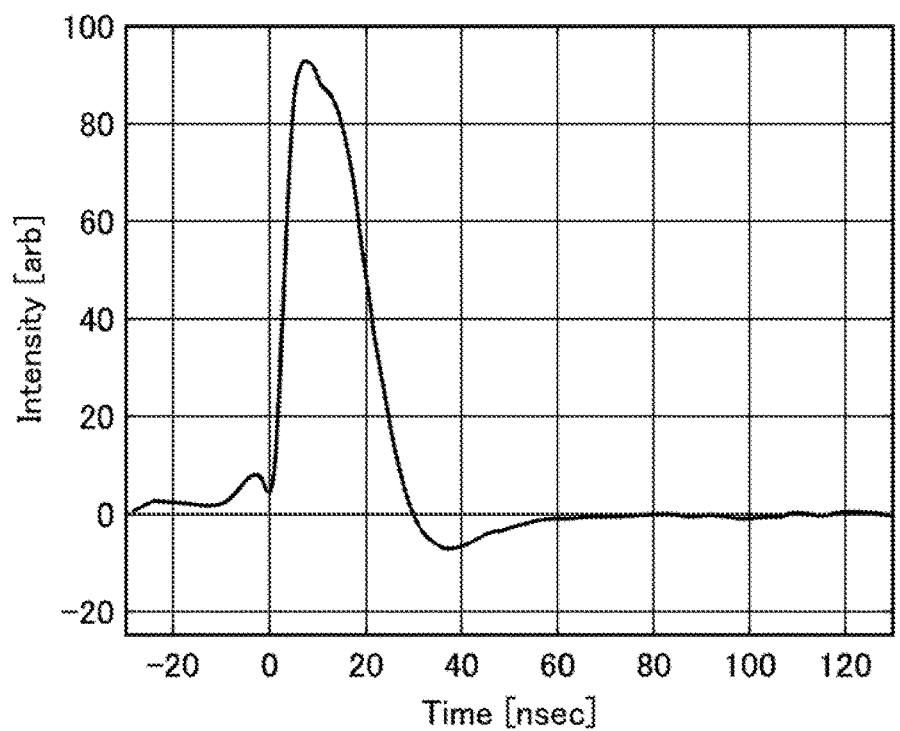
FIG. 5 is a drawing illustrating the response characteristics of the light receiving device according to the embodiment.
Figure 6:
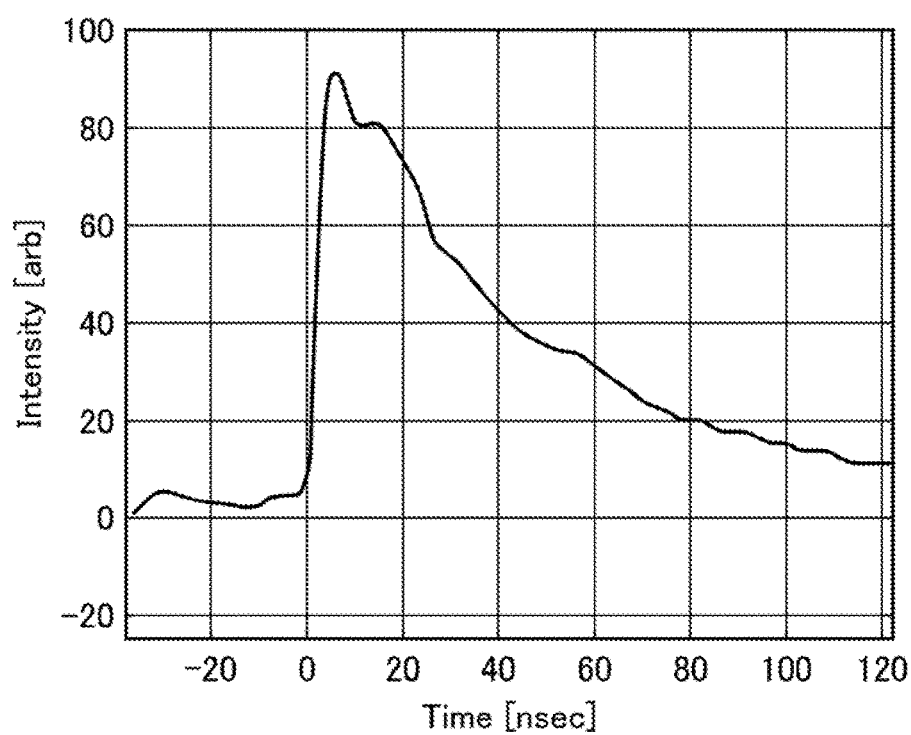
FIG. 6 is a drawing illustrating the response characteristics of the light receiving device having no intermediate layer.

In the following, a description will be given of response characteristics observed when YAG laser light having a pulse width of 20 ns and a wavelength of 1.064 μm enters the light receiving device according to the present embodiment illustrated in FIG. 1 and the light receiving device illustrated in FIG. 3. FIG. 5 illustrates changes in intensity detected when the light receiving device according to the present embodiment illustrated in FIG. 1 receives laser light. FIG. 6 illustrates changes in intensity detected when the light receiving device illustrated in FIG. 3 receives laser light.

In the case of the light receiving device illustrated in FIG. 3, the detected intensity increases in response to a laser light pulse entering the light receiving device as illustrated in FIG. 6, but the detected intensity exhibits a gradual, gentle decrease after the end of the incident laser light pulse, which indicates that responsiveness is not particularly good. In the case of the light receiving device of the present embodiment, on the other hand, the detected intensity increases in response to a laser light pulse entering the light receiving device as illustrated in FIG. 5, and the detected intensity drops to zero within approximately 10 ns after the end of the incident laser light pulse. Accordingly, the light receiving device of the present embodiment has higher responsiveness than the light receiving device illustrated in FIG. 3.

The above description has been directed to a case in which the intermediate layer 30 is implemented as two layers having different composition ratios. Alternatively, the intermediate layer 30 may be implemented as three or more layers having different composition ratios, or may be implemented as a layer having a composition gradient such that the composition ratio changes in a continuous fashion.

Further, the intermediate layer 30 has a thin thickness of 60 nm, so that lattice matching with InP is not necessarily required.

In the present embodiment, the first groove 71 for pixel isolation is formed by removing the p-type contact layer 43, the p-type wide-gap layer 42, and part of the n-type wide-gap layer 41. Namely, the first groove 71 is not formed in the light receiving layer 22, and the side surface of the light receiving layer 22 is not exposed by the first groove 71. SiN can thus be used as the passivation film 50. To be more specific, the side surface of the wide-gap layer 40 is exposed in the first groove 71, but the wide-gap layer 40 is made of InP, so that using SiN for the passivation film 50 covering the side surface of the wide-gap layer 40 at the pn junction 40a does not increase dark current.

If a groove for pixel isolation were formed to a depth reaching the light receiving layer, the side surface of the InGaAs light receiving layer would be exposed. Forming a passivation film made of SiN to cover the side surface of the light receiving layer would not be preferable because of a resulting increase in dark current. In order to avoid an increase in dark current, it would be necessary to use InP to form a passivation film covering the InGaAs side surface. In this case, however, an epitaxial growth process for forming such a passivation film would be required, resulting in complex manufacturing steps being needed. SiN is a preferred material as a passivation film because SiN is easily deposited by plasma CVD (chemical vapor deposition) and has excellent coating property. In place of SiN, SiON may alternatively be used for a passivation film.

Method of Making Light Receiving Device

In the following, a method of making a light receiving device according to the present embodiment will be described with reference to FIG. 7 through FIG. 14.

Figure 7:
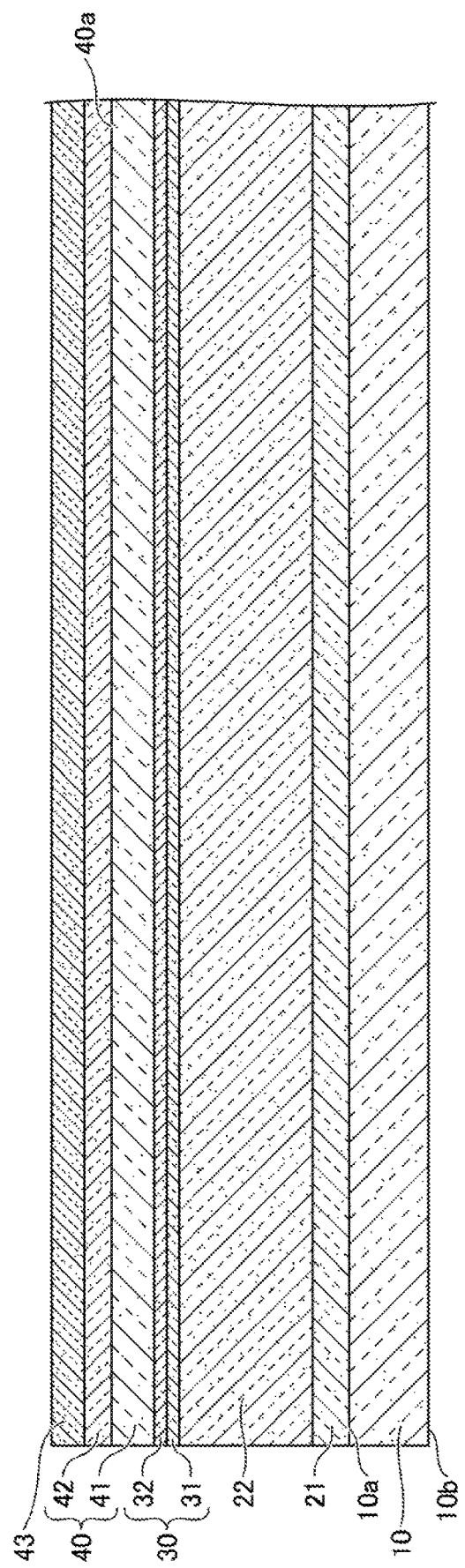
FIG. 7 is a drawing illustrating a step of the method of manufacturing the light receiving device according to the embodiment.

As illustrated in FIG. 7, an n-type contact layer 21, a light receiving layer 22, an intermediate layer 30, an n-type wide-gap layer 41, a p-type wide-gap layer 42, and a p-type contact layer 43 are successively formed through epitaxial growth on one surface 10a of a substrate 10. The intermediate layer 30 is implemented as a first intermediate layer 31 and a second intermediate layer 32 formed in this order on the light receiving layer 22, and the n-type wide-gap layer 41 is formed on the second intermediate layer 32. The metal-organic vapor phase epitaxy (MOVPE) method is used for the epitaxial growth of compound semiconductors described above. The n-type wide-gap layer 41 and the p-type wide-gap layer 42 form the wide-gap layer 40.

The substrate 10 is about 350 μm in thickness, and is semi-insulated with Fe doped as an impurity element. The n-type contact layer 21 is implemented as an n-InP layer having a thickness of approximately 2 μm, and is doped with Si serving as an n-type impurity element at a concentration of about $2 \times 10^{18}$ cm$^{-3}$. The light receiving layer 22 is implemented as an undoped $In_{0.53}Ga_{0.47}As$ layer having a thickness of approximately 3.5 μm, and has a band gap of 0.75 eV.

The first intermediate layer 31 is implemented as an undoped $In_{0.72}Ga_{0.28}As_{0.61}P_{0.39}$ layer having a thickness of approximately 30 nm, and has a band gap of 0.954 eV. The second intermediate layer 32 is implemented as an undoped $In_{0.85}Ga_{0.15}As_{0.33}P_{0.67}$ layer having a thickness of approximately 30 nm, and has a band gap of 1.127 eVe.

The n-type wide-gap layer 41 is implemented as an n-InP layer having a thickness of approximately 0.5 μm, and is doped with Si serving as an n-type impurity element at a concentration of about $2 \times 10^{15}$ cm$^{-3}$. The p-type wide-gap layer 42 is implemented as an p-InP layer having a thickness of approximately 0.2 μm, and is doped with Zn serving as an p-type impurity element at a concentration of about $5 \times 10^{18}$ cm$^{-3}$. The p-type contact layer 43 is implemented as a p-InGaAs layer having a thickness of approximately 0.1 μm, and is doped with Zn serving as a p-type impurity element at a concentration of about $1 \times 10^{19}$ cm$^{-3}$.

Figure 8:
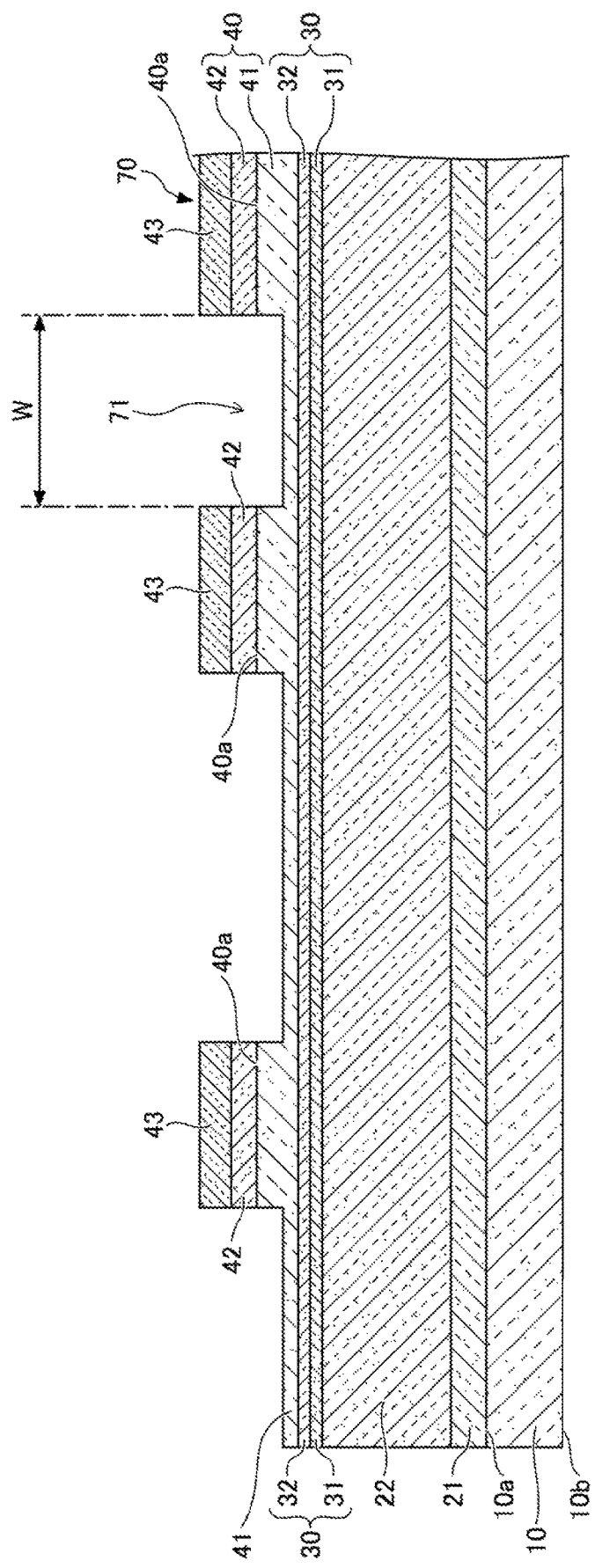
FIG. 8 is a drawing illustrating a step of the method of manufacturing the light receiving device according to the embodiment.

Subsequently, a first groove 71 for pixel isolation is formed as illustrated in FIG. 8. To be more specific, an SiN film (not shown) having a thickness of 100 nm is deposited on the p-type contact layer 43 by plasma CVD, and, then, a photoresist is applied on the deposited SiN film, followed by forming a resist pattern (not shown) through exposure and development by use of an exposure apparatus. The resist pattern has an opening in the area where the first groove 71 is to be formed. The SiN film situated in the opening of the resist pattern is removed by wet etching using a buffered hydrofluoric acid to form an SiN-film mask. The resist pattern (not shown) is then removed by an organic solvent or the like. The p-type contact layer 43, the p-type wide-gap layer 42, and part of the n-type wide-gap layer 41 are removed by dry etching such as RIE in the area where the SiN film has been removed, thereby forming the first groove 71 for pixel isolation. The SiN film (not shown) is thereafter removed by a buffered hydrofluoric acid.

The first groove 71 has a depth of approximately 0.6 μm and a width W of approximately 5 μm, with the n-type wide-gap layer 41 exposed at the bottom thereof. Provision of the first grooves 71 as described above enables formation of mesas 70 serving as individual pixels isolated by the first grooves 71. 4096 pixels in total, for example, may be formed, with 128 pixels at 90-μm pitch in the longitudinal direction and 32 pixels at 90-μm pitch in the lateral direction.

Figure 9:
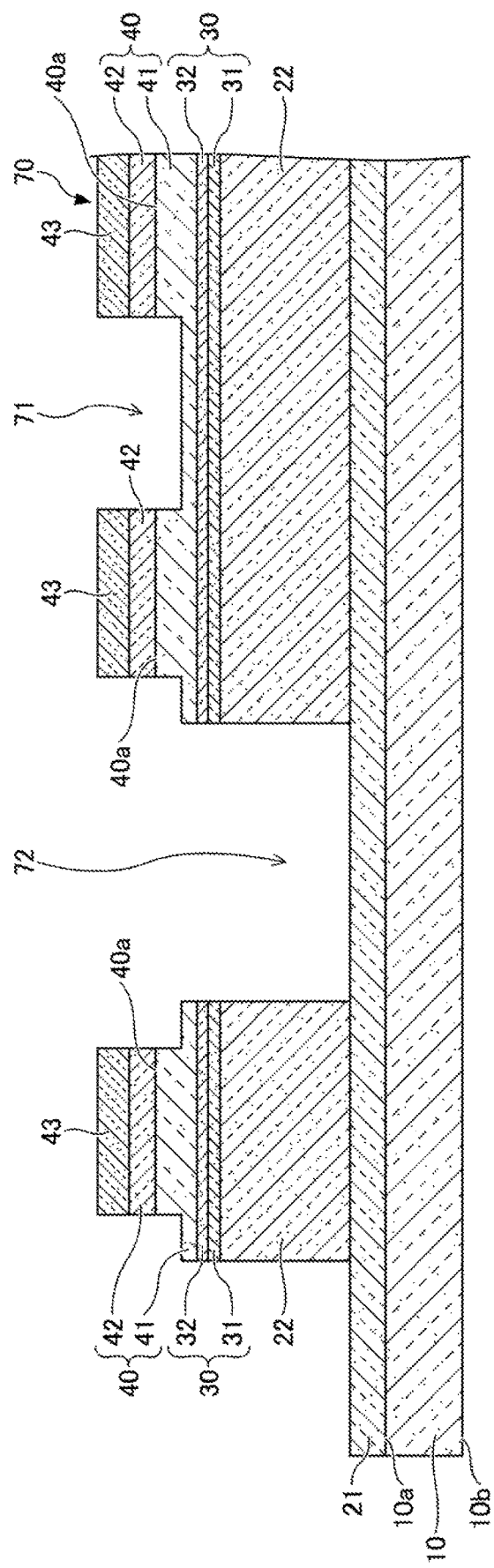
FIG. 9 is a drawing illustrating a step of the method of manufacturing the light receiving device according to the embodiment.

Subsequently, a second groove 72 is formed along the outer perimeter as illustrated in FIG. 9. To be more specific, an SiN film (not shown) having a thickness of 100 nm is deposited on the p-type contact layer 43 and the like by plasma CVD, and, then, a photoresist is applied on the deposited SiN film, followed by forming a resist pattern (not shown) through exposure and development by use of an exposure apparatus. The resist pattern has an opening in the area where the second groove 72 is to be formed. The SiN film situated in the opening of the resist pattern is removed by wet etching using a buffered hydrofluoric acid to form an SiN-film mask. The resist pattern (not shown) is then removed by an organic solvent or the like, and the n-type wide-gap layer 41, the intermediate layer 30, and the light receiving layer 22 are removed by dry etching such as RIE in the area where the SiN film has been removed, thereby exposing the surface of the n-type contact layer 21. The SiN film (not shown) is thereafter removed by a buffered hydrofluoric acid.

Figure 10:
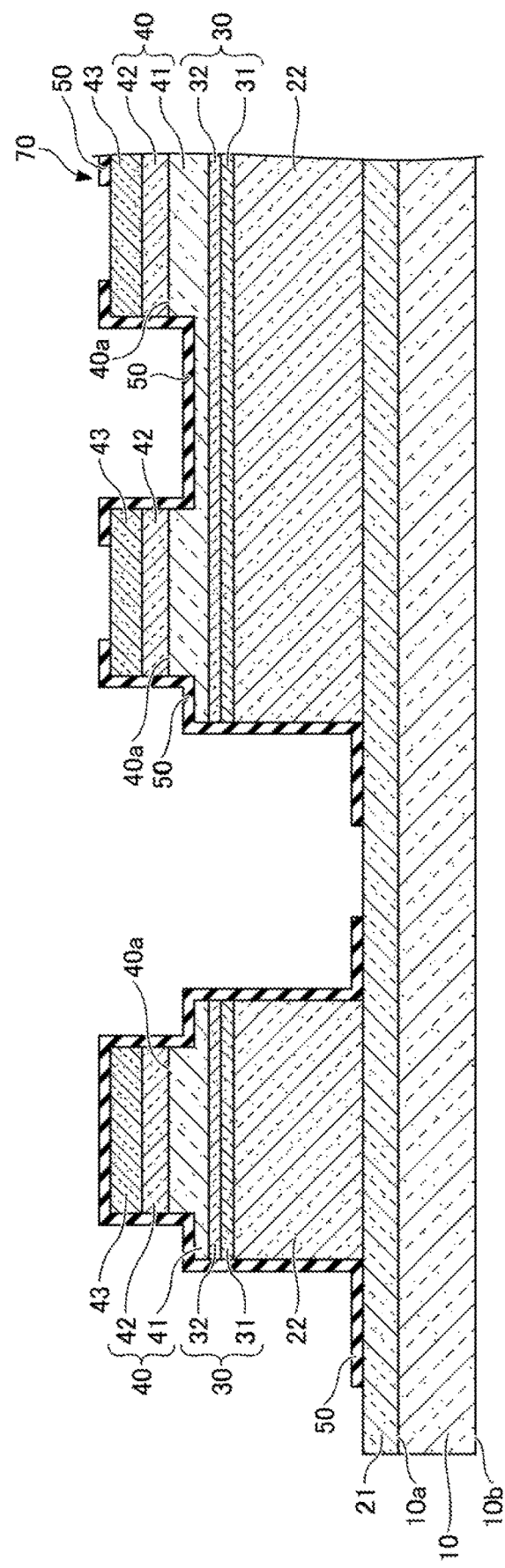
FIG. 10 is a drawing illustrating a step of the method of manufacturing the light receiving device according to the embodiment.

Subsequently, a passivation film 50 is formed as illustrated in FIG. 10. To be more specific, an SiN film (not shown) having a thickness of 100 nm is deposited on the entire surface by plasma CVD, and, then, a photoresist is applied on the deposited. SiN film, followed by forming a resist pattern (not shown) through exposure and development by use of an exposure apparatus. The resist pattern has openings in the area where the n-electrode 61 and the p-electrode 62 are to be formed. The SiN film situated in the openings of the resist pattern is removed by dry etching such as RIE to expose the surface of the p-type contact layer 43 and the surface of the n-type contact layer 21.

Figure 11:
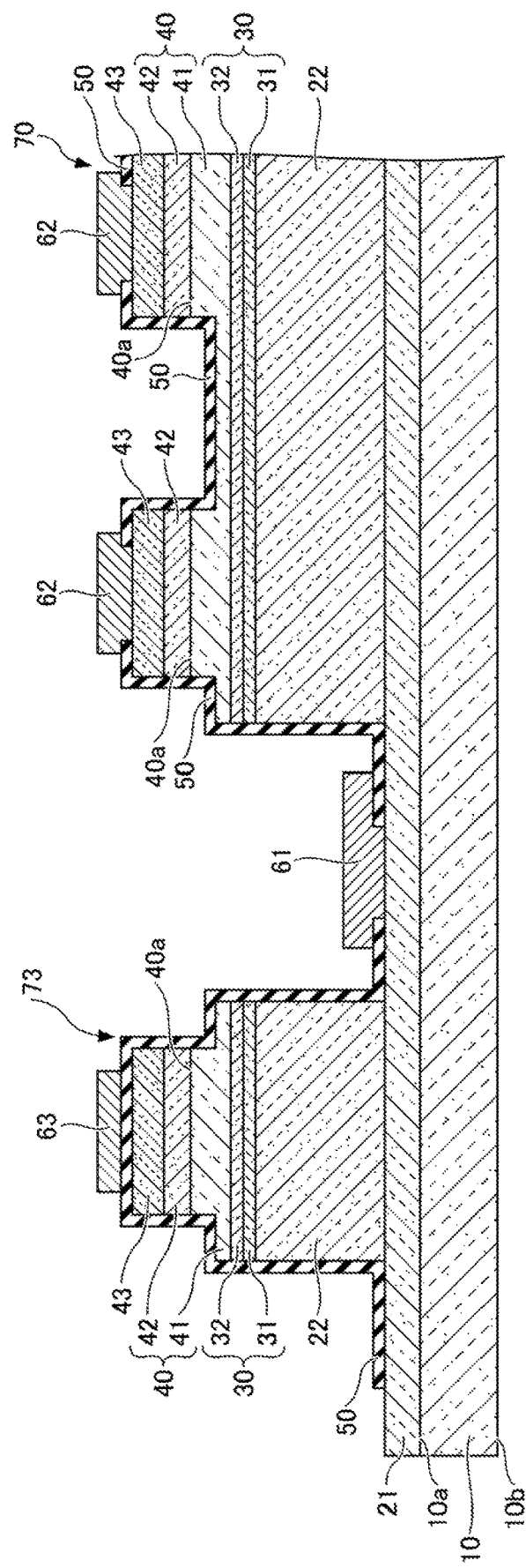
FIG. 11 is a drawing illustrating a step of the method of manufacturing the light receiving device according to the embodiment.

As illustrated, in FIG. 11, an n-electrode 61 is formed on the n-type contact layer 21, and a p-electrode 62 is formed on the p-type contact layer 43. An interconnect electrode 63 is formed on the mesa 73 situated at the outer perimeter, with the passivation film 50 intervening therebetween. The n-electrode 61, the p-electrode 62, and the interconnect electrode 63 are formed by a lift-off method. Specifically, a resist pattern is formed that has an opening in the area where each electrode is to be formed, and a metal film is then formed by EB deposition. The metal film on the resist pattern is removed together with the resist pattern by immersion in an organic solvent or the like.

Figure 12:
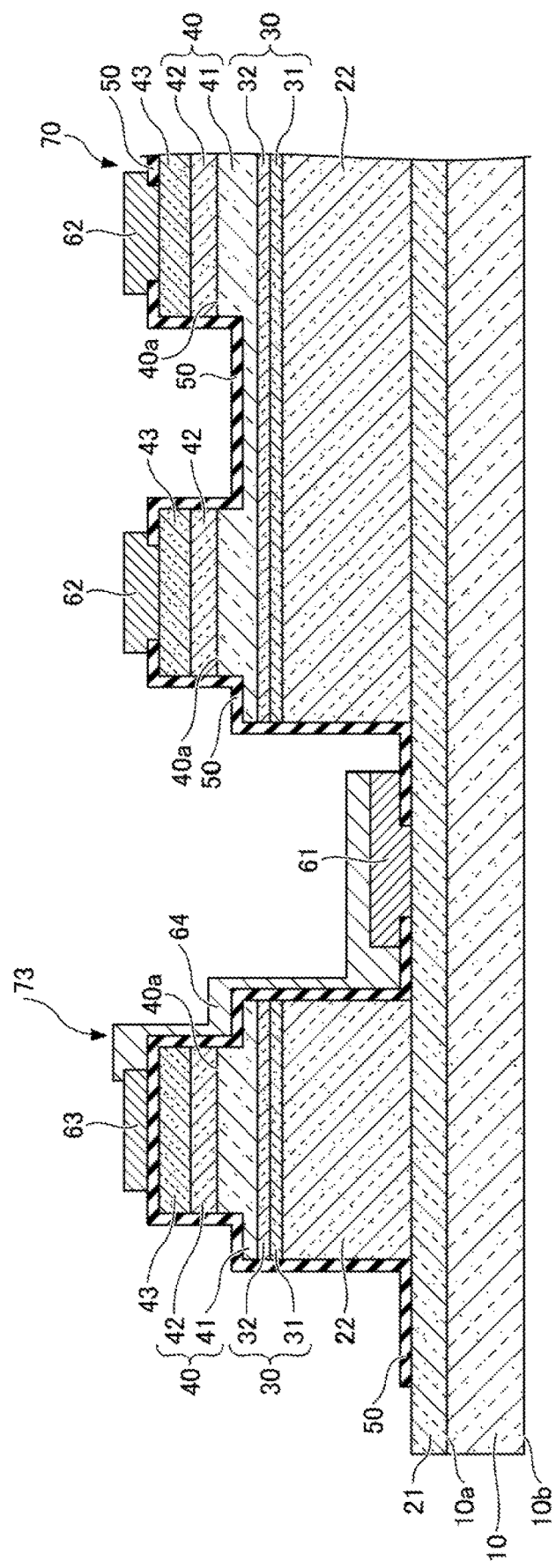
FIG. 12 is a drawing illustrating a step of the method of manufacturing the light receiving device according to the embodiment.

Subsequently, as illustrated in FIG. 12, an interconnect 64 for connecting the n-electrode 61 and the interconnect electrode 63 is formed by a lift-off method. The interconnect 64 is implemented as a laminated film comprised of a Ti film having a thickness of approximately 50 nm and an Au film having a thickness of approximately 600 nm.

Figure 13:
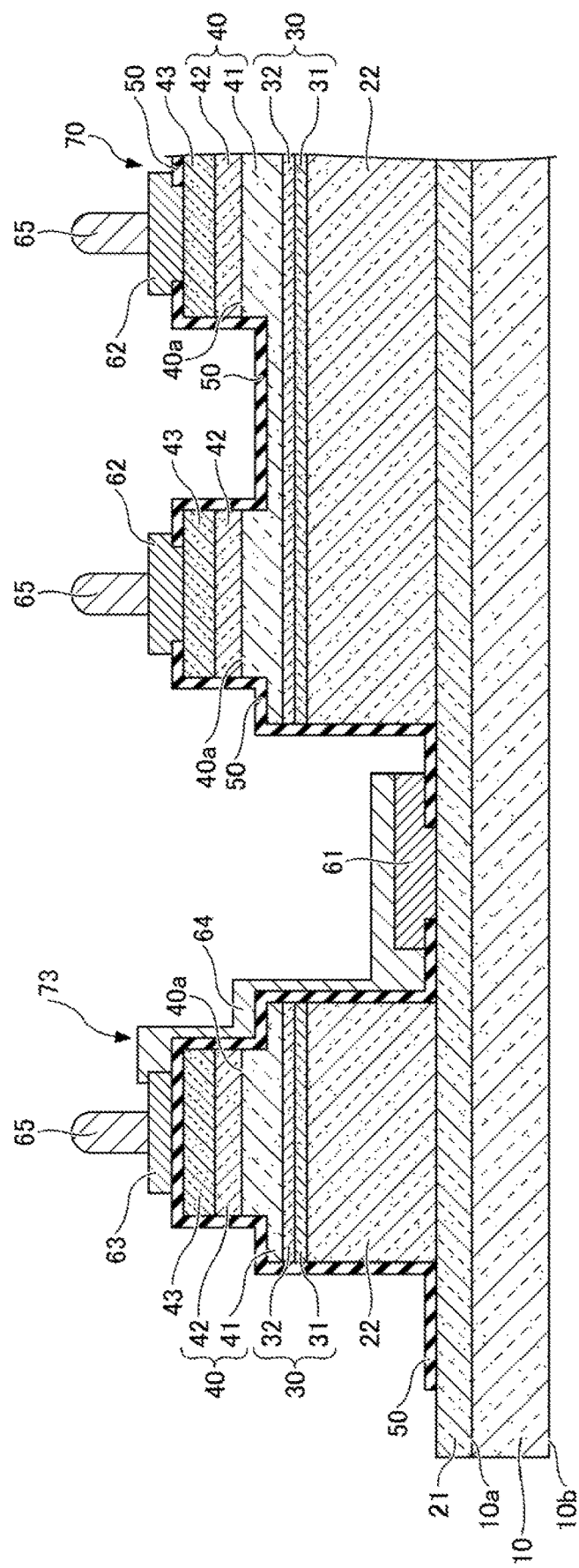
FIG. 13 is a drawing illustrating a step of the method of manufacturing the light receiving device according to the embodiment.

Subsequently, as illustrated in FIG. 13, bumps 65 having a height of approximately 9 μm are formed by a lift-off method on the p-electrodes 62 and the interconnect electrode 63.

Figure 14:
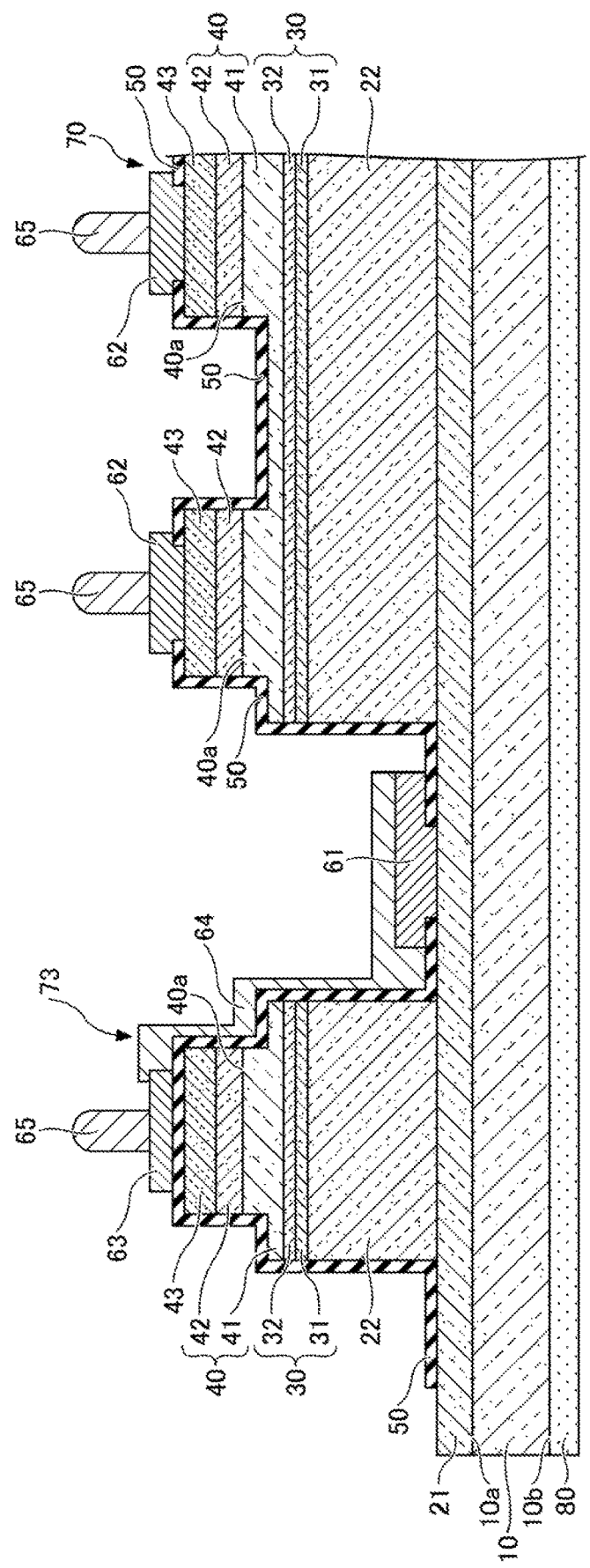
FIG. 14 is a drawing illustrating a step of the method of manufacturing the light receiving device according to the embodiment.

As illustrated in FIG. 14, an SiON anti-reflection film 80 is formed on the opposite surface 10b of the substrate 10. The anti-reflection film 80 is formed by depositing an SiON film by plasma CVD, and has a refractive index of approximately 1.8 and a thickness of 148 nm.

Figure 15:
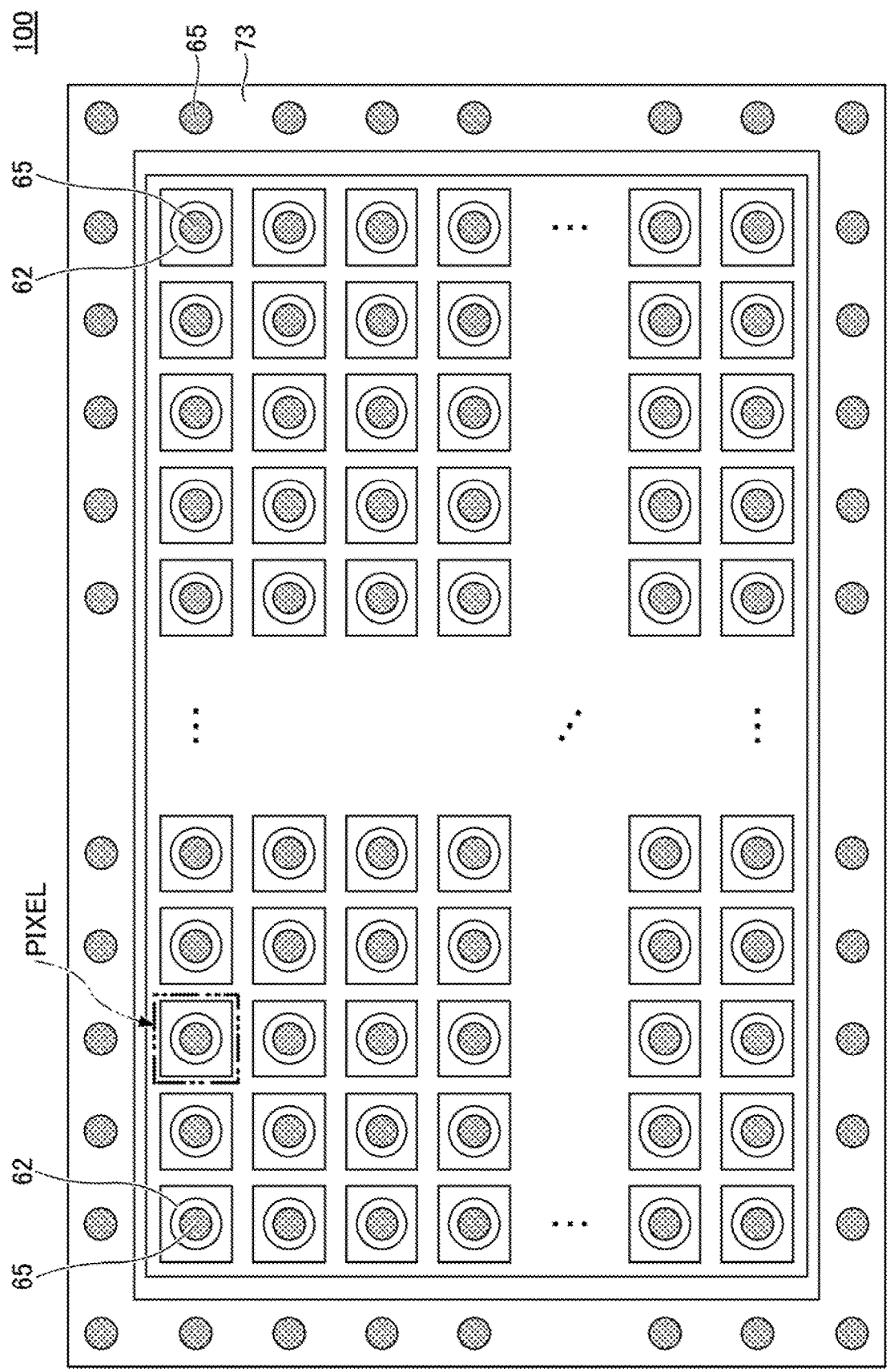
FIG. 15 is a top view of a 2-dimensional-array light receiving device according to an embodiment.
Figure 16:
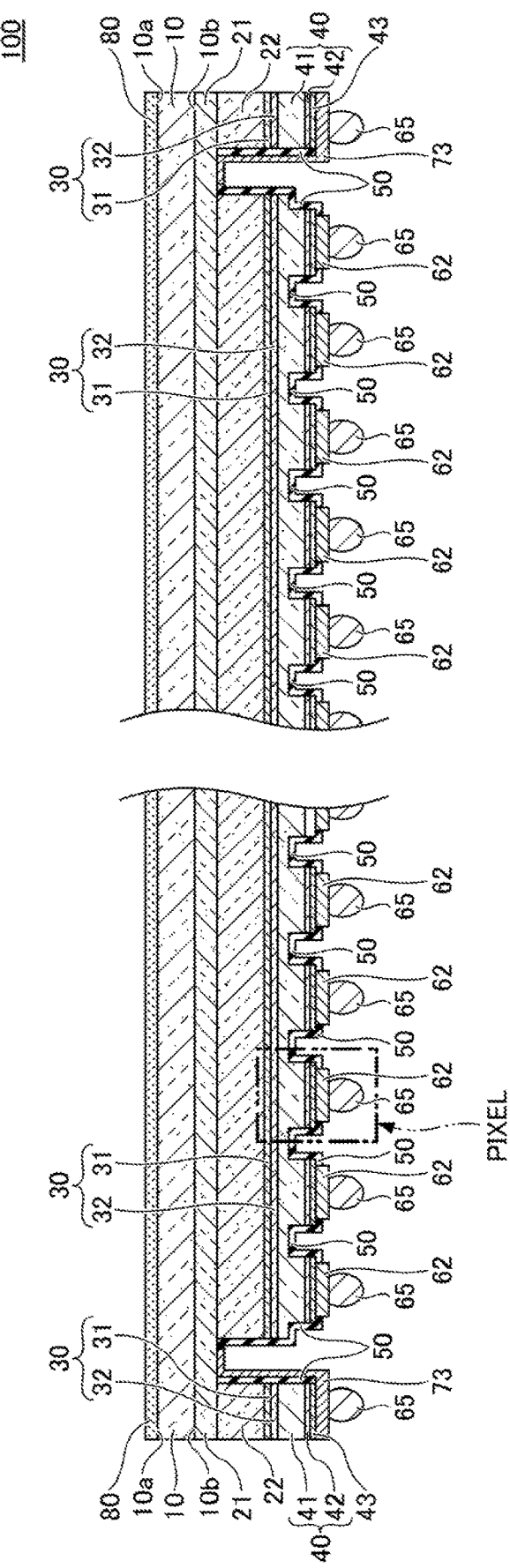
FIG. 16 is a cross-sectional view of the 2-dimensional-array light receiving device according to the embodiment.

FIG. 15 is a top view of a two-dimensional-array light receiving device 100, which is provided as a chip separated after being manufactured by the above-described manufacturing method. In the two-dimensional-array light receiving device 100 illustrated in FIG. 15 and FIG. 16, the dark current per pixel flowing upon the application of a bias voltage of −8 V was a low amount of approximately 0.1 nA at room temperature. The two-dimensional-array light receiving device 100 illustrated in FIG. 15 is such that pixels isolated by the first grooves 71 are arranged in a two-dimensional array. Alternatively, the light receiving device according to the present embodiment may be such that pixels separated by the first grooves 71 are arranged in one-dimensional array.

Light Detecting Apparatus

Figure 17:
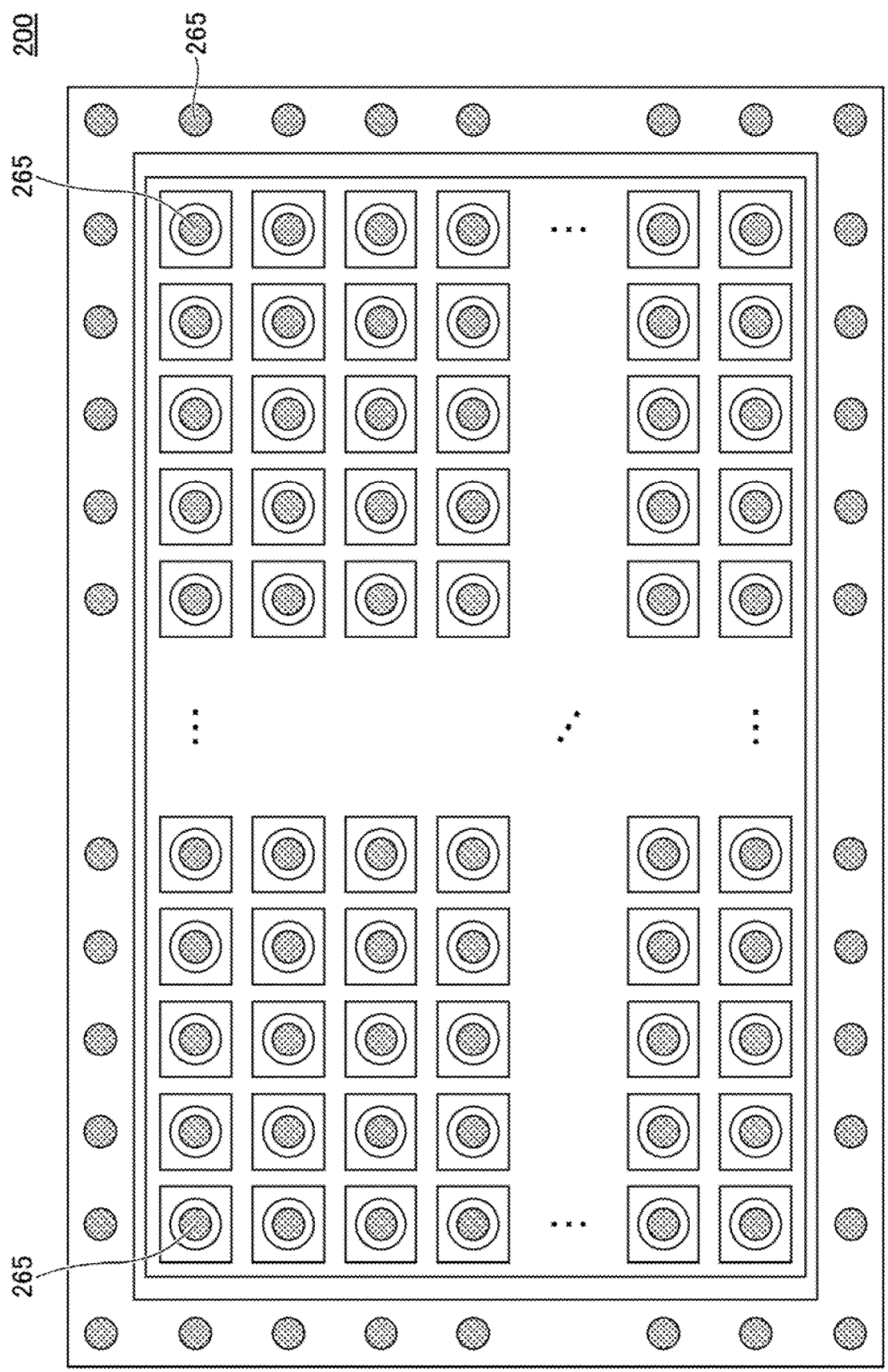
FIG. 17 is a top view of a read-out circuit.

In the following, a light detecting apparatus according to the present embodiment will be described. The light detecting apparatus according to the present embodiment is configured such that the two-dimensional-array light receiving device 100 of the present embodiment illustrated in FIG. 15 and a read-out circuit (ROIC: read-out IC) 200 illustrated in FIG. 17 are bonded to each other via In bumps. The read-out circuit 200 is provided with In bumps 265 corresponding to the In bumps 65 of the two-dimensional-array light receiving device 100. The read-out circuit 200 uses a CMOS (complimentary metal oxide semiconductor) multiplexer.

Figure 20:
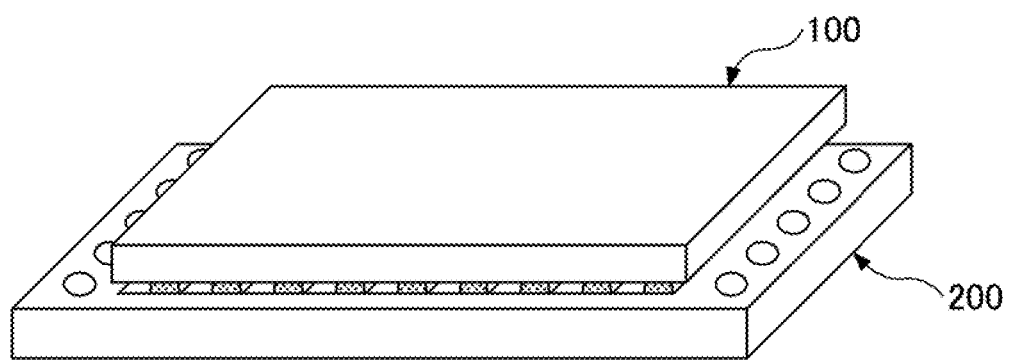
FIG. 20 is a drawing illustrating a step of manufacturing the light detecting apparatus according to the embodiment.

First, the two-dimensional-array light receiving device 100 and the read-out circuit 200 according to the present embodiment are prepared as illustrated in FIG. 18. Next, as illustrated in FIG. 19, the surface of the two-dimensional-array light receiving device 100 on which the In bumps 65 are provided are disposed to oppose the surface of the read-out circuit 200 on which the In bumps 265 are provided, followed by joining the In bumps 65 with the respective In bumps 265. With this arrangement, the two-dimensional-array light receiving device 100 and the read-out circuit 200 are consolidated into a single unit, which serves as the light detecting apparatus of the present embodiment as illustrated in FIG. 20. FIG. 21 is a cross-sectional view of the light detecting apparatus according to the present embodiment. When the two-dimensional-array light receiving device 100 and the read-out circuit 200 are joined together, the In bumps 65 and the In bumps 265 are merged into respective single pieces as In bump connection portions 365. In the light detecting apparatus according to the present embodiment, near-infrared light to be detected is incident through the anti-reflection film 80 to the surface 10b of the substrate 10 opposite the side where the read-out circuit 200 is situated.

Although one or more embodiments have heretofore been described, these embodiments are non-limiting, and various variations and modifications may be made without departing from the scopes defined by the claims.

The present application is based on and claims priority to Japanese patent application No. 2019-155612 filed on Aug. 28, 2019, with the Japanese Patent Office, the entire contents of which are hereby incorporated by reference.

What is claimed is:

1. A light receiving device comprising:
a substrate;
a first contact layer disposed on a surface of the substrate;
a light receiving layer disposed on the first contact layer;
an intermediate layer disposed on the light receiving layer;
a wide-gap layer having a pn junction disposed on the intermediate layer;
a second contact layer disposed on the wide-gap layer; and
a groove formed for pixel isolation by removing the second contact layer and part of the wide-gap layer,
wherein the intermediate layer has a wider band gap than the light receiving layer,
wherein the wide-gap layer has a wider band gap than the intermediate layer, and
wherein the intermediate layer is made of a plurality of layers having different composition ratios, and the plurality of layers are arranged in an ascending order of band gaps from the light receiving layer to the wide-gap layer.

2. The light receiving device as claimed in claim 1, wherein the wide-gap layer includes a p-type wide-gap layer and an n-type wide-gap layer, the n-type wide-gap layer serving as a bottom surface of the groove.

3. The light receiving device as claimed in claim 1, wherein light incident on an opposite surface of the substrate is detected.

4. The light receiving device as claimed in claim 1, wherein the light receiving layer includes InGaAs, and the intermediate layer includes InGaAsP, with the wide-gap layer including InP.

5. The light receiving device as claimed in claim 1, wherein a side surface of the wide-gap layer situated at a sidewall of the groove is covered with a passivation film made of SiN or SiON.

6. The light receiving device as claimed in claim 1, wherein the first contact layer is an n-type contact layer, and the second contact layer is a p-type contact layer.

7. The light receiving device as claimed in claim 1, wherein pixels isolated by a plurality of said grooves are arranged in a one-dimensional array or in a two-dimensional array.

* * * * *